United States Patent [19]
Chi

[11] Patent Number: 5,239,274
[45] Date of Patent: Aug. 24, 1993

[54] VOLTAGE-CONTROLLED RING OSCILLATOR USING COMPLEMENTARY DIFFERENTIAL BUFFERS FOR GENERATING MULTIPLE PHASE SIGNALS

[75] Inventor: Kuang K. Chi, San Jose, Calif.

[73] Assignee: Digital Equipment Corporation, Maynard, Mass.

[21] Appl. No.: 888,762

[22] Filed: May 26, 1992

[51] Int. Cl.[5] .................. H03B 5/02; H03B 27/00
[52] U.S. Cl. .................. 331/57; 331/108 B; 331/177 R
[58] Field of Search ............ 331/57, 108 B, 177 R; 307/602, 603, 605, 606, 608

[56] References Cited

U.S. PATENT DOCUMENTS

| | | | |
|---|---|---|---|
| 4,072,910 | 2/1978 | Dingwall et al. | 331/57 |
| 4,501,002 | 2/1985 | Auchterlonie | 375/86 |
| 4,504,748 | 3/1985 | Oritani | 307/530 |
| 4,641,048 | 2/1987 | Pollock | 307/591 |
| 4,697,112 | 9/1987 | Ohtani et al. | 307/530 |
| 4,769,564 | 9/1988 | Garde | 307/530 |
| 4,853,654 | 8/1989 | Sakurai | 331/57 |
| 4,876,519 | 10/1989 | Davis et al. | 331/108 B X |
| 4,879,530 | 11/1989 | Wilhelm et al. | 331/57 X |
| 4,884,041 | 11/1989 | Walker | 331/57 |
| 4,893,095 | 1/1990 | Thommen | 331/57 |
| 5,012,142 | 4/1991 | Sonntag | 307/602 |
| 5,036,216 | 7/1991 | Hohmann et al. | 309/269 |
| 5,061,907 | 10/1991 | Rasmussen | 331/57 |

OTHER PUBLICATIONS

Kurita et al., "PLL-Based BiCMOS On-Chip Clock Generator for Very High-Speed Microprocessor," IEEE Journal of Solid-State Circuits, vol. 26, No. 4, Apr. 1991, pp. 585-589.

Miyazawa et al., "A BiCMOS PII-Based Data Separator Circuit With High Stability and Accuracy," IEEE Journal of Solid-State Circuits, vol. 26, No. 2, Feb. 1991, pp. 116-121.

M. G. Johnson & E. L. Hudson, "A Variable Delay Line PLL for CPU-Coprocessor Synchronization," IEEE Journal of Solid-State Circuits, vol. 23, No. 5, Oct. 1988, pp. 1218-1223.

M. H. Wakayama & A. A. Abidi, "A 30-MHz Low-Jitter High-Linearity CMOS Voltage-Controlled Oscillator," IEEE Journal of Solid-State Circuits, vol. SC-22, No. 6, Dec. 1987, pp. 1074-1081.

*Primary Examiner*—Siegfried H. Grimm
*Attorney, Agent, or Firm*—Arnold, White & Durkee

[57] ABSTRACT

Differential buffers are used in a voltage-controlled oscillator to provide pairs of complementary phase signals. The preferred arrangement includes a ring of the differential buffers. Each differential buffer has a current control input, and the current control inputs of the buffers are all connected to a control voltage input to simultaneously adjust the propagation delay of each of the buffers. In contrast to a conventional ring oscillator, which has an odd number of stages, a ring oscillator made of differential buffers can have an even number of buffers to provide a number of phases that is a multiple of four. The differential buffer preferably includes a pair of CMOS inverters sharing a common PMOS current sourcing transistor and a common NMOS current sinking transistor.

6 Claims, 4 Drawing Sheets

VOLTAGE-CONTROLLED RING OSCILLATOR USING COMPLEMENTARY DIFFERENTIAL BUFFERS FOR GENERATING MULTIPLE PHASE SIGNALS

BACKGROUND OF THE INVENTION

Field of the Invention

The present invention relates to a voltage-controlled oscillator for use in a phase lock loop incorporating complementary-metal-oxide semiconductor (CMOS) digital logic components.

Description of the Related Art

Phase lock loops provide a means for synthesizing a clock having a frequency or phase that is precisely synchronized to a reference at a different frequency or phase. The clock is generated by a voltage-controlled oscillator (VCO) having its phase regulated by a phase comparison to the reference. In one typical application, a selected clock frequency is generated from a reference frequency by dividing the clock frequency by a first selected number A, dividing the reference frequency by a second selected number B, and comparing the phase of the two quotient signals to derive a phase difference signal that is used as a control signal to the VCO. When a condition of phase lock is achieved in the phase lock loop, the clock frequency is related to the reference frequency by the ratio A/B.

A phase lock loop can generate multiple phases of a reference signal. To generate N phases, the clock from the VCO is divided by N, and the dividend signal is compared directly to the reference, so that the clock frequency becomes N times the reference frequency, and therefore is one of the N phases. The other N-1 phases are generated by also dividing the clock by N, but using different initial remainders for each division. The division for each phase is performed by a divide-by-N counter that is clocked by the clock signal and initially present with a respective remainder value.

The conventional method of using a phase lock loop for generating multiple phase signals suffers from the disadvantage that the VCO must operate at a frequency that is progressively higher than the reference frequency for increased numbers of phases. This limitation has increased the difficulty of integrating the VCO directly onto a semiconductor chip which uses the multiple phase signals. This limitation has also impeded the development of certain integrated circuit chips that could use signal processing techniques based upon the availability of a large number of multiple phase signals.

SUMMARY OF THE INVENTION

In accordance with a basic aspect of the invention, a voltage-controlled oscillator has a ring of differential buffers each having a pair of differential outputs, and a voltage-controlled current source supplying a controlled current to each of the buffers for modulating the speed of signal propagation through the buffers Each buffer provides two complementary phases exactly 180° apart, and the VCO provides a total of 2M phases spaced apart by 180°/M, where M is the number of buffers in the ring.

In a preferred construction, each differential buffer includes two CMOS inverters sharing a common PMOS current source transistor and a common NMOS current sink transistor. The gates of the PMOS current source transistors are wired in parallel to receive a first bias voltage, and the gates of the NMOS current source transistors are wired in parallel to receive a second bias voltage. The first and second bias voltages are supplied by a current mirror circuit so that each differential buffer receives approximately the same nominal current from its respective PMOS current source and its respective NMOS current sink, and so that the current is adjusted by a control voltage to the VCO. Lower current produces a slower slew rate of each buffer stage and therefore a lower frequency, and higher current produces a higher slew rate and therefore a higher frequency.

The differential nature of the buffers provide precise complementary phase signals, which are not provided by a conventional ring oscillator. The differential buffers also introduce less high frequency noise into the power supply network than single-ended buffers and offer improved power supply noise rejection. The differential buffers also permit the use of an even number of buffers as opposed to the requirement for an odd number of single-ended buffers in a conventional ring oscillator. An even number of differential buffers, for example, could generate four clock phases, which are used in some digital logic chip designs.

BRIEF DESCRIPTION OF THE DRAWING

Other objects and advantages of the present invention will become apparent upon reading the following detailed description and upon reference to the drawings, in which.

While the invention will be described in connection with certain preferred embodiments, it will be understood that it is not intended to limit the invention to these particular embodiments. On the contrary, it is intended to cover all modifications, alternatives, and equivalent arrangements within the scope of the invention, as defined by the appended claims.

DESCRIPTION OF THE PREFERRED EMBODIMENTS

Figure 1:
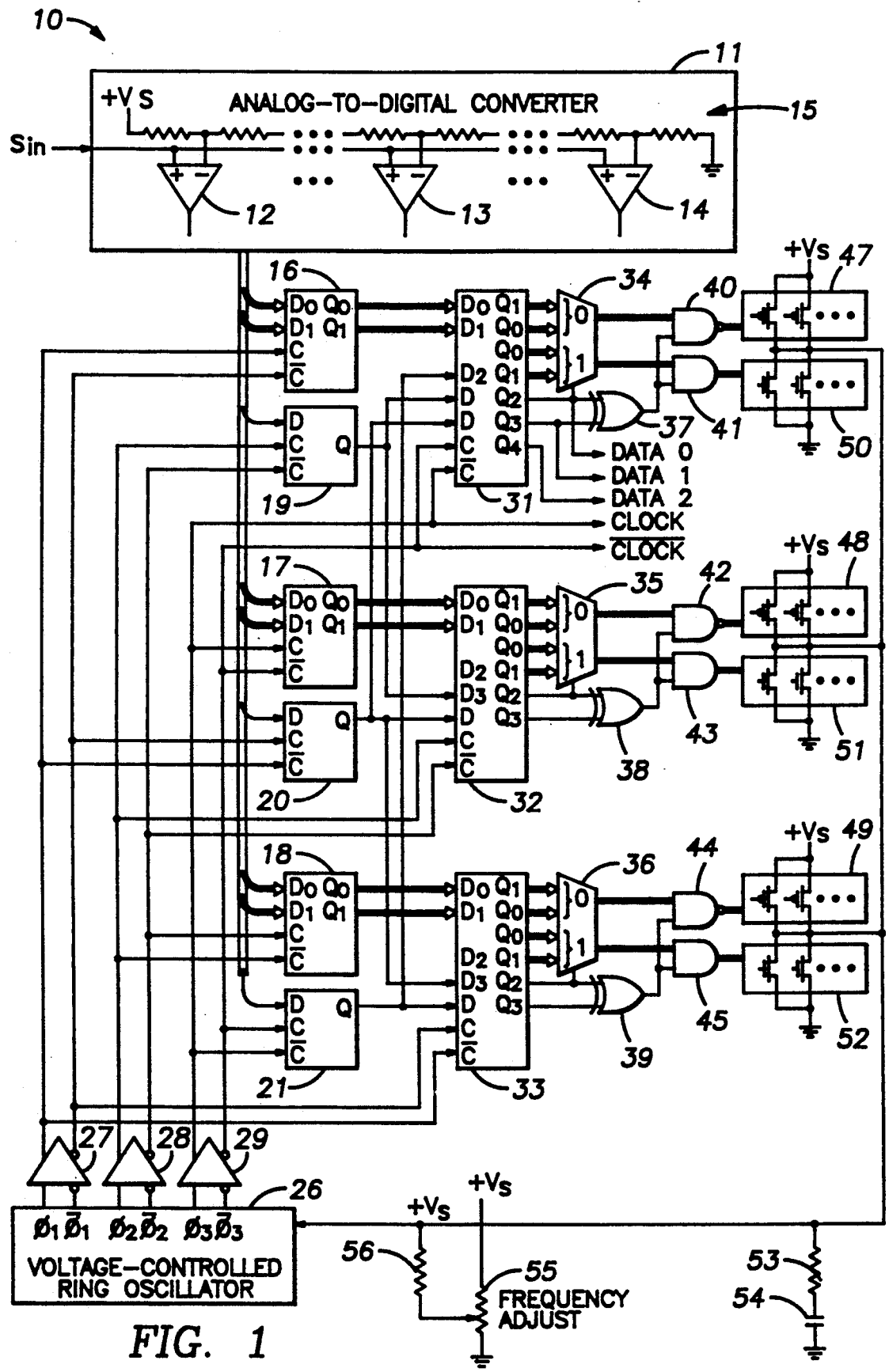
FIG. 1 illustrates a data and clock recovery circuit employing a voltage-controlled oscillator of the present invention.

Referring now to FIG. 1, there is shown a circuit generally designated 10 for recovering binary data and a clock from an analog input signal $S_{in}$. It is assumed, for example, that the binary data in the input signal $S_{in}$ has a data rate of 250 megabits per second, corresponding to a data sampling rate of 250 megahertz.

A conventional method of recovering binary data and a clock from an analog signal is to sample the signal at a rate of twice the data rate. The series of samples includes data samples at the 250 MHz rate. The signal is sampled at twice the data rate in order to obtain, between each neighboring pair of data samples, an intermediate sample from which a clocking phase error can be estimated. When a transition or change in logic state occurs between the neighboring data samples, then the intermediate sample has a magnitude responsive to the magnitude of the clocking phase error, and a polarity dependent upon the polarity of the clocking phase error and also dependent on the direction of the logic transition. Therefore, from each pair of neighboring samples and the intermediate sample, an indication of the clocking phase error can be obtained when there is a change in logic state of the estimated data samples. A voltage-controlled oscillator (VCO) controls the sampling of the analog signal and receives a voltage-control input responsive to the clocking phase error signal.

In a conventional implementation, the voltage-controlled oscillator oscillates at the data rate to provide the data clock. The data samples are obtained coincident with rising transitions of the data clock, and the intermediate samples are obtained coincident with the falling transitions of the data clock. This conventional method of data and clock recovery, however, would preclude the use of integrated circuit technologies such as conventional complementary metal oxide semiconductor (CMOS) logic circuits, which presently cannot generate clocking signals in excess of about 50 MHz.

It is known, however, that CMOS delay flip-flops or registers can reliably sample a digital signal having frequencies in excess of at least ten times the maximum clocking rate of the CMOS circuits themselves. This is a consequence of the fact that a MOS transistor can sample a digital signal without needing to amplify that signal. Sampling at a 500 MHz rate, however, would also require ten delay flip-flops or registers which are clocked by ten different phases of a 50 MHz clock. In other words, the sampling flip-flops or registers perform a kind of serial-to-parallel conversion in which the CMOS circuitry obtains and processes groups of ten samples at a 50 MHz rate.

Turning now to the specific sampling and clock recovery circuit 10 of FIG. 1, the analog signal $S_{in}$ is converted to a set of digital logic signals by a so-called "flash" analog-to-digital converter 11. The analog-to-digital converter 11 includes a series of comparators 12, 13, 14 which compare the level of the analog signal to respective predefined threshold levels set by a resistive voltage divider generally designated 15. The comparators include a comparator 13 having a threshold level set at the zero point of the analog signal, representing the mid-point between a logic one and a logic zero, so that the output of the comparator 13 indicates whether or not the analog signal carries a logic zero or a logic one. The analog-to-digital converter 15 further has a set of comparators including the comparator 12 indicating whether the analog signal has a level significantly greater than the zero level, and a set of comparators including the comparator 14 indicating whether or not the analog signal has a level significantly less than the zero level. The comparators 12, 14 are used for deriving the clocking phase error signal, as will be further described below.

To sample the analog signal $S_{in}$ at a rate of twice the data clocking rate, the circuit 10 includes a set of registers 16, 17, 18 for receiving the intermediate samples, and delay flip-flops 19, 20, 21 for receiving the data samples. In the specific example of FIG. 1, there is a combined total of six such registers and flip-flops, so that the clocking rate of the CMOS circuits, which comprise the registers and flip-flops, is one-third the clocking rate of the binary data in the analog signal $S_{in}$.

Each of the registers 16, 17, 18 and delay flip-flops 19, 20, 21 is clocked by a respective one of six phases generated by a voltage-controlled oscillator generally designated 25. The voltage-controlled oscillator 25 includes a voltage-controlled ring oscillator 26, and a set of three complementary differential buffers 27, 28, 29 providing the plural-phase signals to the flip-flops and registers. Therefore, the registers and flip-flops receive samples in the following sequence: first the register 16, then the flip-flop 19, then the register 17, then the flip-flop 20, then the register 18, and finally, the flip-flop 21. This cycle is repeated periodically at a rate of one-third of the data rate.

In order to synchronize the data samples in each group of three data samples received in a single sampling cycle, the circuit 10 includes a register 31 receiving the three data samples from flip-flops 19, 20, 21. Moreover, so that a clocking phase error estimate can be generated from each pair of neighboring samples including at least one of the three data samples, the register 31 also receives the intermediate sample from the register 16, and the circuit 10 includes additional registers 32, 33. The register 32 receives the neighboring data samples from the flip-flops 19 and 20, together with the intermediate sample from the register 17. The register 33 receives the neighboring data samples from the flip-flops 20, 21, together with the intermediate sample from the register 18.

To derive a clocking phase error estimate from an intermediate sample, the polarity of the intermediate sample is selectively switched by a multiplexer in response to the direction of the data transition. For this purpose, the circuit 10 includes multiplexers 34, 35, 36 for selectively switching the polarity of the respective intermediate samples from the registers 16, 17, 18. Moreover, the result of each multiplexer is valid only when there is a respective data transition. Therefore, the presence or absence of data transitions are detected by respective exclusive-OR gates 37, 38, 39, and the outputs of the multiplexers 34, 35, 36 are enabled by respective NAND or AND gates 40, 41, 42, 43, 44, 45 controlled by the transition indicating signals from the respective exclusive-OR gates.

The outputs of the NAND gates 40, 42, 44 represent clocking phase errors which should be corrected by increasing the frequency of the voltage-controlled oscillator 25, and phase error signals from the AND gates 41, 43, 45 represent clocking phase errors which should be corrected by decreasing the frequency of the voltage-controlled oscillator. For increasing the VCO frequency, the gates 40, 42, 44 enable current sourcing PMOS transistors 47, 48, 49. For decreasing the VCO frequency, the gates 41, 43, 45 enable respective NMOS current sinking transistors 50, 51, 52, respectively.

When a clocking phase error is detected, the phase of the VCO 25 is shifted by a corresponding amount in order to correct the phase error. The size of the correction is proportional to the current sourced or sinked by the transistors 47, 48, 49, 50, 51, 52, and the value of a resistor 53. A large phase error causes a large number of the transistors to turn on and conduct a large current, and a small phase error causes a small number of the transistors to turn on and conduct a small current.

The ability of the VCO 25 to generate a stable data clock is improved by a capacitor 54, which provides a long term memory of the frequency at which a phase-lock condition is achieved. The ability of the VCO 25 to initially acquire a phase-lock condition (i.e., the capture time) depends on the difference between the free-running frequency of the voltage-controlled oscillator 25 and the locking frequency. Therefore, it may be desirable to provide a potentiometer 55 for adjusting the free-running frequency of the VCO 25, and to limit deviation in frequency of the voltage-controlled oscillator 25 about this free-running frequency by selecting a value for a resistor 56.

The data and clock recovery circuit 10 of FIG. 1 obtains a very high effective sampling rate by clocking a plurality of registers with respective phases of a sampling clock. Although six distinct sampling phases are shown in FIG. 1, the circuit 10 as shown in FIG. 1 could be modified to use additional sampling phases by adding, for each additional pair of complementary phases, additional registers similar to the registers 17, 20, 32. It should be appreciated, however, that as additional phases are used, the phase error between the multiple phases becomes critical because a small phase error between the phases is equivalent to a much larger phase error at the equivalent higher sampling frequency. Therefore, the success of the multi-phase sampling technique used by the circuit 10 of FIG. 1 is dependent upon the ability of the VCO 25 to generate the multi-phase clocking signals with very precise phase relationships.

Figure 2:
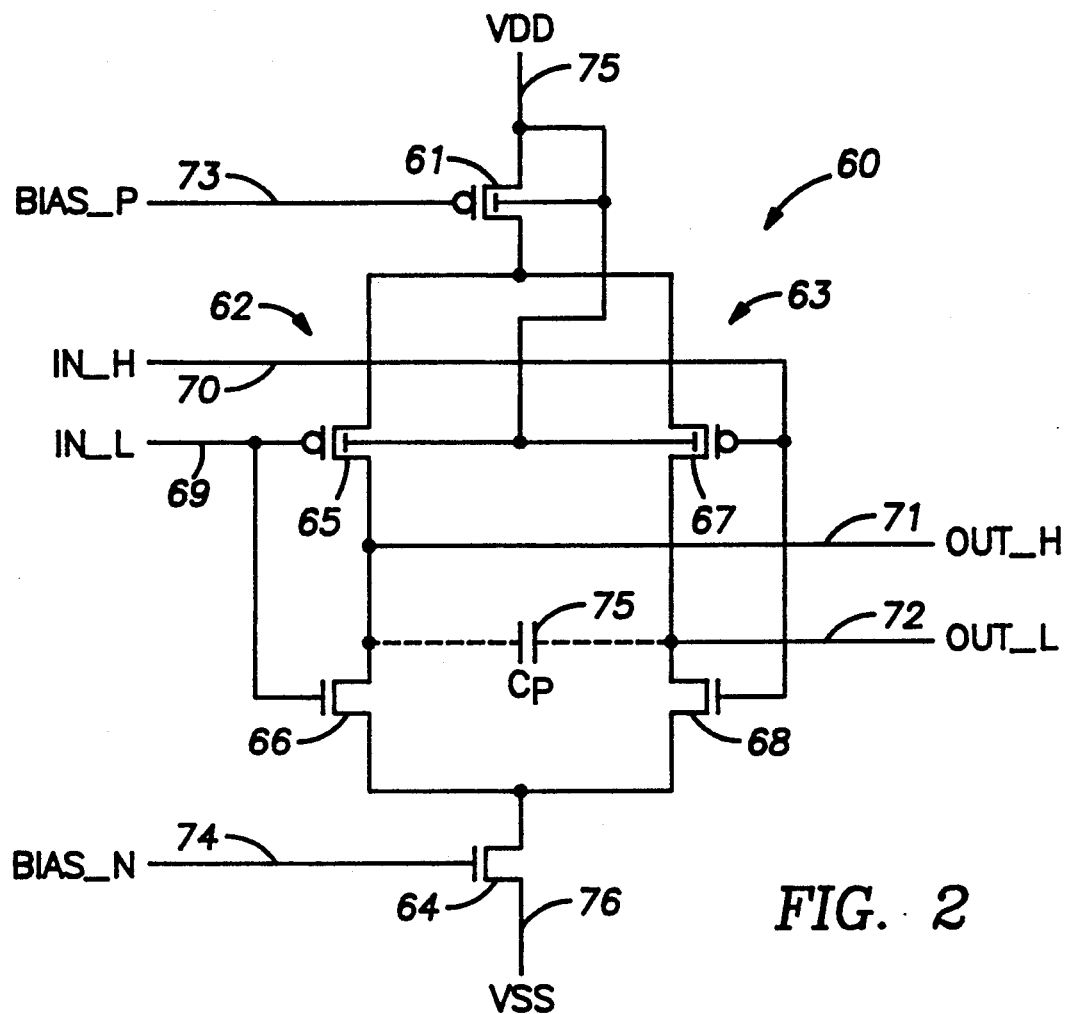
FIG. 2 is a schematic diagram of a preferred construction for a complementary differential buffer in accordance with an aspect of the present invention.

The present invention uses a differential buffer to obtain a pair of complementary clocking signals having a very precise phase difference of 180°. A preferred form of differential buffer is shown in FIG. 2. The differential buffer includes a PMOS current sourcing transistor 61, a pair of CMOS invertors generally designated 62, 63, and a current sinking NMOS transistor 64. The CMOS invertor 62 includes a PMOS transistor 65 and a NMOS transistor 66. In a similar fashion, the invertor 63 includes a PMOS transistor 67 and a NMOS transistor 68. Power supply current sourced by the transistor 61 and sinked by the transistor 64 is shared among the two invertors 62, 63. Each of the invertors 62, 63 receives one of two differential input lines 69, 70 and provides a respective one of two differential output lines 71, 72.

In operation, the current sourced by the transistor 61 and sinked by the transistor 64 is divided between the invertors 62, 63 as approximately a linear function of the difference in voltage across the input lines 69, 70. In a similar fashion, the voltage across the output lines 71, 72 is responsive to the difference in voltage across the input lines 69, 70, but there is a delay due to parasitic capacitance $C_P$ across the output lines 71, 72 of the buffer 60. In FIG. 2, this parasitic capacitance is represented by a capacitor 75.

During oscillation in a ring of differential buffers 60, as further described below with reference FIGS. 4 and 5, the delay of signal propagation through each buffer is proportional to the parasitic capacitance $C_P$ and inversely proportional to the power supply current sourced and sinked by the transistors 61, 64. This propagation delay can be adjusted by adjusting the current in response to bias voltages on lines 73 and 74. Moreover, the parasitic capacitance $C_P$ may be augmented by capacitance integrated into the circuit in order to lower the frequency range of the VCO.

So that the phases of the multi-phase signals will be uniformly distributed over 360°, it is desirable for the capacitance $C_P$ to be the same for each of the buffers in the ring oscillator. This can be ensured by using identical circuit lay-outs for each buffer and identical loading upon the outputs of each buffer in the ring. Identical loading upon the outputs of each buffer may be facilitated by connecting the differential outputs of each buffer to differential inputs of intermediate buffers, such as the buffers 27, 28, and 29 in FIG. 1, which clock the circuitry using the multi-phase signals. The intermediate buffers 27, 28 and 29 may also serve to increase the rise time and amplitude of the multi-phase signals when additional capacitance is integrated into the buffers in the ring oscillator.

It is desirable to set the bias voltages 73, 74 so that the transistor 61 nominally sources approximately the same amount of current nominally sinked by the transistor 64. Although the circuitry insures that the transistor 61 sources exactly the same amount of current sinked by the transistor 64, adjustment of the bias voltages on the lines 63, 64 in such a fashion will insure that the plural-phase signals will be biased at a mid-level between the power supply voltage VDD and substrate ground voltage VSS across the power supply lines 75 and 76.

Figure 3:
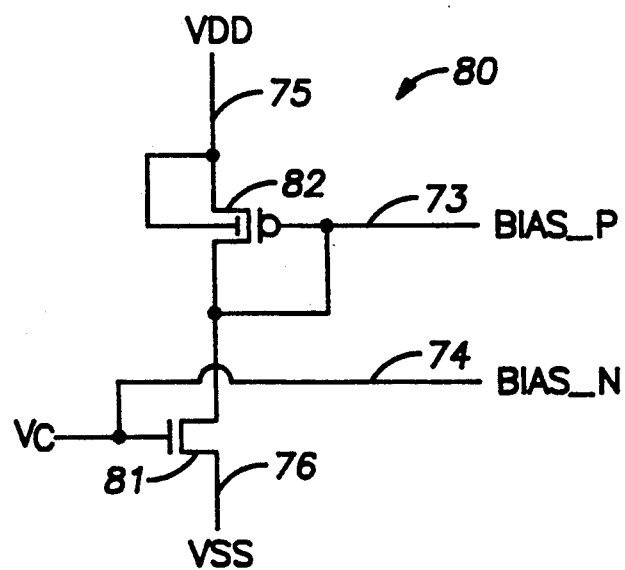
FIG. 3 is a schematic diagram of a bias voltage generator used for controlling the current in the complementary differential buffer of FIG. 2.

Turning now to FIG. 3, there is shown a schematic diagram of a current mirror circuit for generating bias signals for the buffer 60 of FIG. 2. The current mirror circuit 80 includes an NMOS transistor 81 having a gate receiving a voltage-control signal $V_c$, and a PMOS transistor 82. The gate of the PMOS transistor 82 is connected to the source of the PMOS transistor 82 and also to the drain of the NMOS transistor 81. Therefore, a voltage is generated on the gate of the NMOS transistor 82 such that the same channel current flows through both of the transistors 81, 82 in response to the control voltage $V_c$. Moreover, the gate voltages on the transistors 81, 82 are fed as bias signals to the buffer 60 of FIG. 2 to obtain the same nominal channel currents in the current source and sink transistors 61, 64 of the buffer 60 in FIG. 2.

Figure 4:
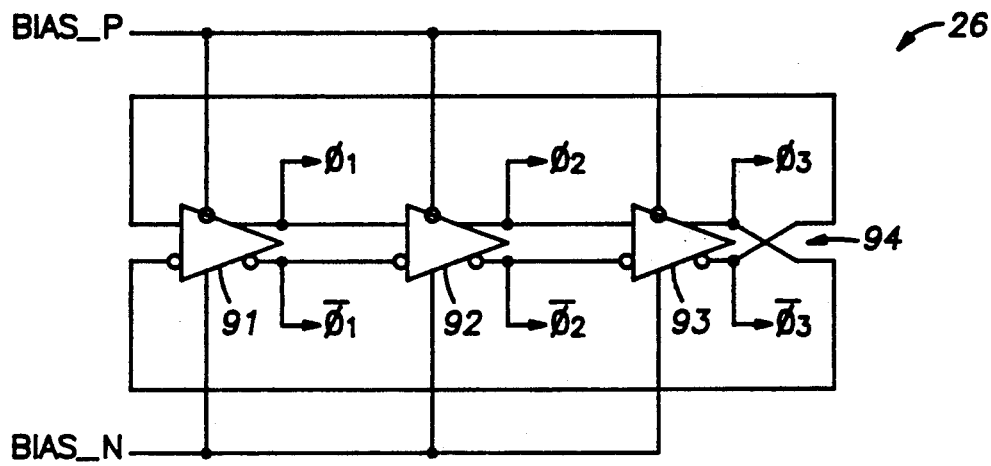
FIG. 4 is a schematic diagram of a voltage-controlled ring oscillator using an odd number of differential buffers in accordance with an aspect of the present invention.
Figure 5:
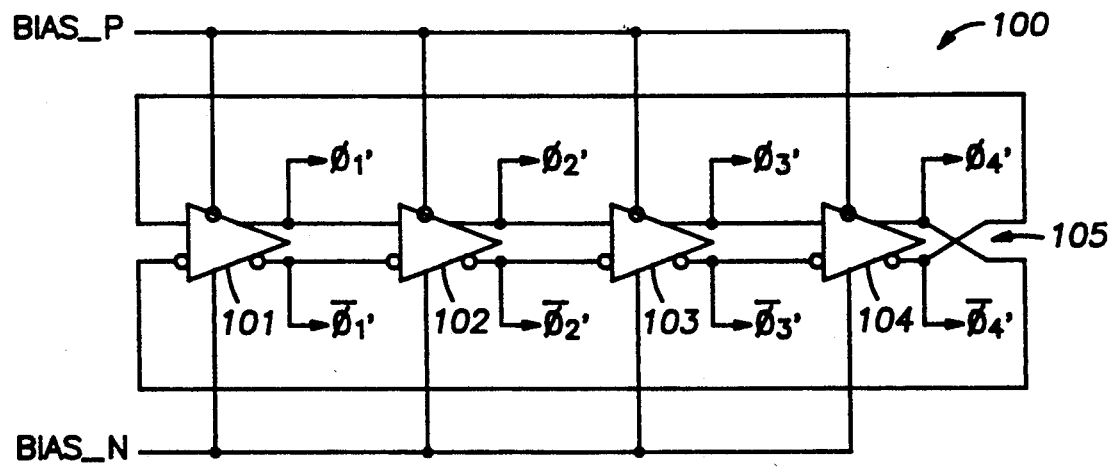
FIG. 5 is a schematic diagram of a voltage-controlled ring oscillator employing an even number of differential buffers in accordance with another aspect of the present invention.

Turning now to FIG. 4, there is shown a schematic diagram of the voltage-controlled ring oscillator 26. The ring oscillator includes three complementary differential buffers 91, 92, 93, each of which has the construction as shown in FIG. 2. At DC, there is a 180° phase inversion around the ring, as should be apparent from the crossing of signal lines at the location generally designated 94. By using the differential buffers in the ring oscillator, each of the buffers provide a pair of signals in precise complementary phase relationship. Moreover, since the inputs and outputs of each buffer are differential, the circuit offers improved signal-to-noise ratios, better noise rejection properties, and less introduction of noise into the power supply network.

Another advantage of using differential buffers in a ring oscillator is that an even number of differential buffers can be used. As shown in FIG. 5, a ring oscillator 100 has four differential buffers 101, 102, 103, and 104. Therefore, it is possible to generate a multi-phase signal having a number of phases that is four or a multiple of four. This is not possible using a conventional ring oscillator having inverting buffers. In such a conventional ring oscillator, the required 180° phase shift at DC is provided by using an odd number of inverting buffers. For the circuit 100 shown in FIG. 5, the required 180° phase inversion is provided by crossed connections generally designated 105. Four phase clocks, for example, are used in synchronous data demodulators, as further described in U.S. Pat. No. 4,501,002, issued Feb. 19, 1985, and incorporated herein by reference.

The use of an even number of differential buffers in a ring oscillator, however, does put some restrictions on the characteristics of the differential buffers. In particular, the differential gain of each buffer must always exceed the common mode gain or else the ring oscillator will be subject to the possibility of a lock-up condition. For the differential buffer 60 of FIG. 2, for example, such a lock-up condition can occur when the NMOS and PMOS transistors in the inverters 62, 63 have thresholds selected for rendering the channels of the transistors entirely non-conductive when the transistor gate voltages are within certain ranges of possible voltage levels. Such thresholds are desired for conventional CMOS digital logic transistors so that there is negligible power dissipation in a logic gate carrying a static logic signal. Therefore, a conventional CMOS manufacturing process may not provide for the fabrication of a buffer according to the circuit of FIG. 2 which does not lock up in the circuit of FIG. 5.

In the buffer 60 of FIG. 2, the lock-up condition may occur when both of the input lines 69, 70 in FIG. 2 are either at the substrate voltage VSS or are at the power supply voltage VDD. When the input lines 69, 70 are at the substrate voltage VSS, then, for conventional CMOS digital logic transistors, the channels of the NMOS transistors 66, 68 are rendered non-conductive, causing both of the output lines 71, 72 to rise to the power supply voltage VDD. In such a case, the differential gain of the buffer is zero due to the total cutoff of current through the buffer. The common mode gain, however, is negative in this case. In a similar fashion, when both of the input lines 69, 70 are at the power supply voltage VDD, then the PMOS transistors 65, 67 will have their channels rendered entirely non-conductive, causing the output lines 71, 72 to assume the substrate voltage VSS. Therefore, the differential gain is again zero due to the complete cutoff of current through the buffer 60, and the common mode gain is again negative. This negative common mode gain and lack of differential mode gain may cause a lock-up condition in a ring oscillator having an even number of such buffers.

Figure 6:
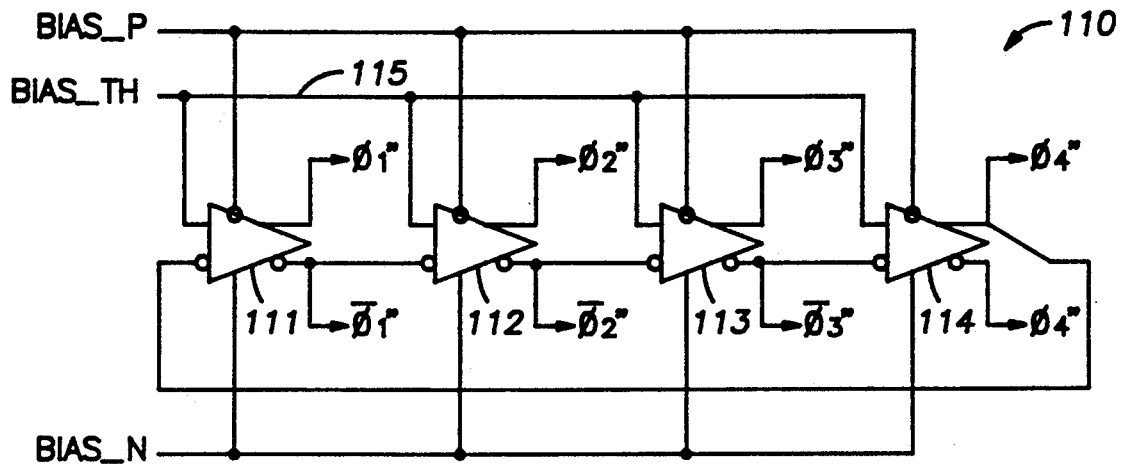
FIG. 6 is a schematic diagram of an alternative circuit for a voltage-controlled ring oscillator employing an even number of differential buffers.
Figure 7:
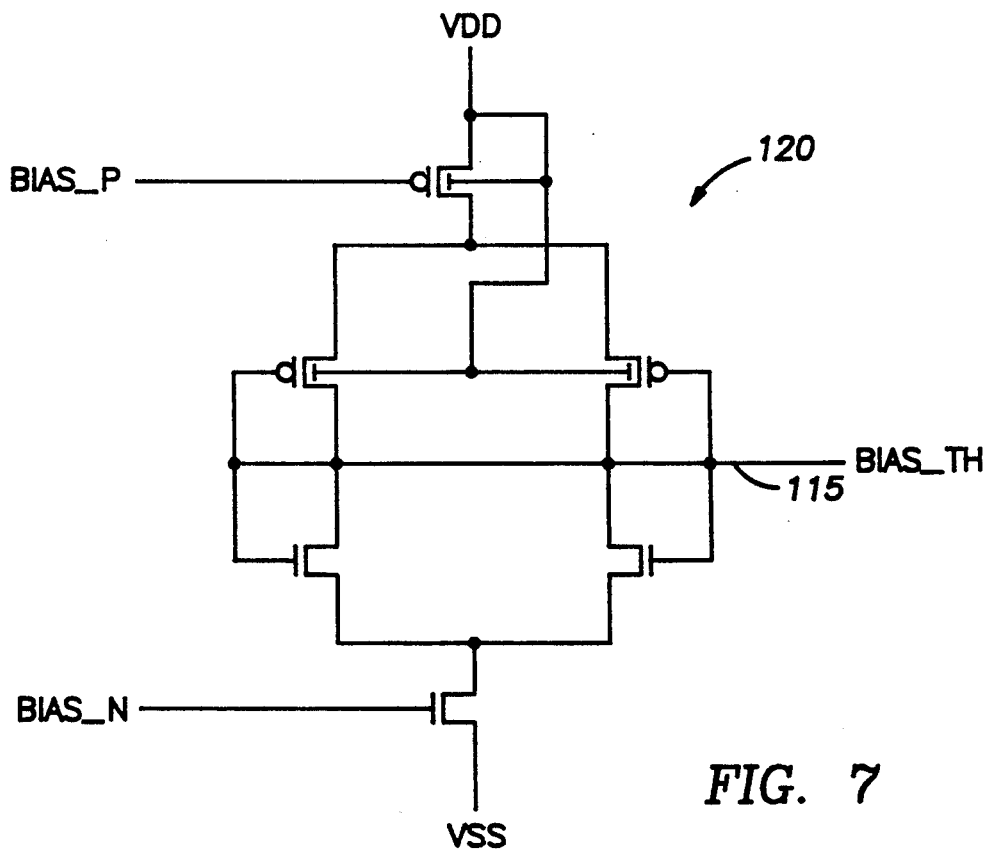
FIG. 7 is a schematic diagram of a threshold bias circuit used in connection with the voltage-controlled ring oscillator of FIG. 6.

The possibility of a lock-up condition may be avoided by using non-standard digital logic CMOS transistors in the buffer 60 of FIG. 2 or by using a different differential buffer design. The possibility of a lock-up condition can also be avoided by a slight change in the ring buffer circuit of FIG. 5. As shown in the alternative circuit of FIG. 6, one input of each of the differential buffers 111, 112, 113, 114 in a ring oscillator 110 is wired to a threshold bias line 115. As shown in the schematic diagram of FIG. 7, the threshold bias is generated by a "dummy" differential buffer generally designated 120 having its two inputs and two outputs connected to the threshold bias line 115. Because one input of each of the differential buffers in FIG. 6 is always connected to the mid-range bias threshold, it is not possible to cut off all of the current through any of the differential buffers 111, 112, 113, 114 under any conditions, and therefore, the common mode lock-up condition cannot occur.

In view of the above, there has been described a differential buffer compatible with the standard CMOS digital logic manufacturing process. This differential buffer provides a pair of precise complementary phase signals. Either an odd or an even number of these differential buffers can be wired in a ring to make a voltage-controlled oscillator providing multiple phases precisely subdividing a 360° interval. These precise multiple phases can be used as sampling clocks to achieve very high effective sampling rates. The speed of data sampling and clock recovery in a CMOS integrated circuit can therefor be increased by an order of magnitude. A voltage-controlled ring oscillator having an even number of stages permits the direct synthesis of four clock phases which are used in some digital logic chip designs.

What is claimed is:

1. A multi-phase voltage-controlled oscillator comprising:

a ring of differential buffers; each of said differential buffers having a current control input for regulating current through the differential buffer, a pair of differential outputs, and a pair of differential inputs, at least one of said differential inputs being connected to at least one differential output of a prior one of said differential buffers in said ring; and a control voltage input connected to each of said current control inputs of said differential buffers in said ring for simultaneously adjusting current through all of said differential buffers in said ring in response to a control voltage on said control voltage input;

wherein said ring of differential buffers has an even number of said differential buffers, and each of said differential buffers includes:

a pair of CMOS inverters, each of said inverters including a PMOS transistor and an NMOS transistor, and each of said inverters having a respective one of said differential inputs and having a respective one of said differential outputs;

a PMOS current source transistor sourcing current to both of the CMOS inverters; and an NMOS current sink transistor sinking current from both of the CMOS inverters.

2. A multi-phase voltage-controlled oscillator comprising:

a ring of differential buffers; each of said differential buffers having a current control input for regulating current through the differential buffer, a pair of differential outputs, and a pair of differential inputs, at least one of said differential inputs being connected to at least one differential output of a prior one of said differential buffers in said ring; and a control voltage input connected to each of said current control inputs of said differential buffers in said ring for simultaneously adjusting current through all of said differential buffers in said ring in response to a control voltage on said control voltage input;

wherein said ring of differential buffers has an even number of said differential buffers, and each of said differential buffers includes:

a pair of CMOS inverters, each of said inverters including a PMOS transistor and an NMOS transistor, and each of said inverters having a respective one of said differential inputs and having a respective one of said differential outputs;

a PMOS current source transistor sourcing current to both of the CMOS inverters; and an NMOS current sink transistor sinking current from both of the CMOS inverters; and wherein said multi-phase voltage-controlled oscillator further includes means for avoiding a possibility of a lock-up condition in said ring of differential buffers.

3. The multi-phase voltage-controlled oscillator as claimed in claim 2, wherein said means for avoiding a possibility of a lock-up condition comprises a threshold bias generator supplying a threshold bias signal to one of the differential inputs of each of said differential buffers in said ring of differential buffers.

4. The multi-phase voltage-controlled oscillator as claimed in claim 2, wherein said CMOS transistors are standard digital logic CMOS transistors causing said possibility of a lockup condition in said ring of differential buffers.

5. A multi-phase voltage-controlled oscillator comprising:

a ring of differential buffers; each of said differential buffers having a current control input for regulating current through the differential buffer, a pair of differential outputs, and a pair of differential inputs, at least one of said differential inputs being connected to at least one differential output of a prior one of said differential buffers in said ring; and a control voltage input connected to each of said current control inputs of said differential buffers in said ring for simultaneously adjusting current through all of said differential buffers in said ring in response to a control voltage on said control voltage input;

wherein said ring of differential buffers has an even number of said differential buffers, and each of said differential buffers includes:

a pair of CMOS inverters, each of said inverters including a PMOS transistor and an NMOS transistor, and each of said inverters having a respective one of said differential inputs and having a respective one of said differential outputs;

a PMOS current source transistor sourcing current to both of the CMOS inverters; and an NMOS current sink transistor sinking current from both of the CMOS inverters; and wherein said multi-phase voltage-controlled oscillator further includes a threshold bias generator supplying a threshold bias signal to one of the differential inputs of each of said differential buffers in said ring of differential buffers, thereby avoiding a possibility of a lock-up condition in said ring of differential buffers.

6. The multi-phase voltage-controlled oscillator as claimed in claim 5, wherein said CMOS transistors are standard digital logic CMOS transistors causing said possibility of a lockup condition in said ring of differential buffers.

* * * * *